US012730382B2

(12) United States Patent
Cho et al.

(10) Patent No.: US 12,730,382 B2
(45) Date of Patent: Sep. 8, 2026

(54) METHOD OF CONFIGURING EXTREME ULTRA-VIOLET (EUV) ILLUMINATION SYSTEM, AND EUV EXPOSURE METHOD USING THE EUV ILLUMINATION SYSTEM

(71) Applicant: Samsung Electronics Co., Ltd., Suwon-si (KR)

(72) Inventors: Yeongchan Cho, Suwon-si (KR); Minjae Kim, Suwon-si (KR); Sungmin Nam, Suwon-si (KR); Seunghune Yang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 8 days.

(21) Appl. No.: 18/806,848

(22) Filed: Aug. 16, 2024

(65) Prior Publication Data

US 2025/0138434 A1 May 1, 2025

(30) Foreign Application Priority Data

Oct. 31, 2023 (KR) ........................ 10-2023-0148434

(51) Int. Cl.
*G03F 7/00* (2006.01)

(52) U.S. Cl.
CPC ...... *G03F 7/70516* (2013.01); *G03F 7/70504* (2023.05); *G03F 7/70033* (2013.01)

(58) Field of Classification Search
CPC ............. G03F 7/70516; G03F 7/70504; G03F 7/70033; G03F 7/70075; G03F 7/70125; G03F 7/705; G03F 7/70058
See application file for complete search history.

(56) References Cited

U.S. PATENT DOCUMENTS

| | | | | |
|---|---|---|---|---|
| 7,376,543 | B2 | 5/2008 | Zinn | |
| 8,200,468 | B2 | 6/2012 | Ye et al. | |
| 8,542,340 | B2 * | 9/2013 | Ye | G03F 7/70666 355/77 |
| 9,588,438 | B2 | 3/2017 | Hsu et al. | |
| 9,934,346 | B2 | 4/2018 | Hansen | |
| 11,042,687 | B2 * | 6/2021 | Chen | G06F 30/39 |
| 11,086,230 | B2 | 8/2021 | Hsu et al. | |
| 11,360,388 | B2 | 6/2022 | deVilliers et al. | |
| 11,366,382 | B2 * | 6/2022 | Dmitriev | G03F 1/68 |

(Continued)

FOREIGN PATENT DOCUMENTS

| | | | | |
|---|---|---|---|---|
| EP | 2815277 | B1 * | 12/2021 | G02B 26/0833 |
| KR | 10-0468741 | B1 | 1/2005 | |
| KR | 10-0960450 | B1 | 5/2010 | |

(Continued)

*Primary Examiner* — Hung V Nguyen
(74) *Attorney, Agent, or Firm* — Fish & Richardson P.C.

(57) ABSTRACT

Provided are a method of configuring an optimized extreme ultraviolet (EUV) illumination system, and an EUV exposure method using the EUV illumination system. The method of configuring the EUV illumination system includes calculating an aerial image by performing an optical simulation with respect to each of EUV point sources, summing up the aerial images based on EUV mapping, searching for a combination of the EUV point sources by using a fitness value with respect to the summed aerial image, and configuring the EUV illumination system as a combination of the EUV point sources, which has a maximum fitness value.

19 Claims, 19 Drawing Sheets

(56) References Cited

U.S. PATENT DOCUMENTS

| | | | |
|---|---|---|---|
| 11,506,984 | B2 | 11/2022 | Hsu et al. |
| 11,846,889 | B2 | 12/2023 | Hsu et al. |

FOREIGN PATENT DOCUMENTS

| | | | |
|---|---|---|---|
| KR | 10-1043016 | B1 | 6/2011 |
| KR | 10-1279462 | B1 | 6/2013 |
| KR | 10-2063229 | B1 | 1/2020 |
| KR | 10-2020-0123247 | A | 10/2020 |
| KR | 10-2021-0122845 | A | 10/2021 |

* cited by examiner

FIG. 3B

PFM

FFM

| | | | | |
|---|---|---|---|---|
| 1a | 1b | 1c | 1d | 1e |
| 2a | 2b | 2c | 2d | 2e |
| 3a | 3b | 3c | 3d | 3e |
| 4a | 4b | 4c | 4d | 4e |
| 5a | 5b | 5c | 5d | 5e |
| ⋮ | ⋮ | ⋮ | ⋮ | ⋮ |
| 336a | 336b | 336c | 336d | 336e |

| Item | # 1 | # 2 | # 3 | ··· | # P |
|---|---|---|---|---|---|
| CDx | 26.90 | Fail | 26.90 | ··· | 26.90 |
| CDy | 18.63 | Fail | 18.41 | ··· | 18.67 |
| ratio | 1.44 | – | 1.46 | ··· | 1.46 |
| NILSx | 2.08 | – | 2.06 | ··· | 2.12 |
| NILSy | 2.10 | – | 2.08 | ··· | 2.14 |
| $Fitness_{NILS}$ | 38.51 | – | 90.70 | ··· | 34.30 |
| $Fitness_{ratio}$ | 2.09 | – | 2.07 | ··· | 2.13 |
| Fitness | 50.61 | – | 102.77 | ··· | 46.43 |

METHOD OF CONFIGURING EXTREME ULTRA-VIOLET (EUV) ILLUMINATION SYSTEM, AND EUV EXPOSURE METHOD USING THE EUV ILLUMINATION SYSTEM

CROSS-REFERENCE TO RELATED APPLICATION

This application is based on and claims priority under 35 U.S.C. § 119 to Korean Patent Application No. 10-2023-0148434, filed on Oct. 31, 2023, in the Korean Intellectual Property Office, the disclosure of which is incorporated by reference herein in its entirety.

BACKGROUND

The inventive concepts relate to an extreme ultra-violet (EUV) illumination system, and more particularly, to a method of configuring a EUV illumination system based on EUV point sources, and an EUV exposure method using the EUV illumination system.

As line widths of a semiconductor circuit have become finer, a light source of shorter wavelength is used. For example, EUV is used as an exposure light source, and the number of layers using the EUV as exposure light sources inevitably has been increasing. Due to an absorption characteristic of the EUV, a reflective-type EUV mask is generally used in an EUV exposure process. Also, illumination optics for transferring the EUV to an EUV mask and projection optics for projecting EUV reflected by the EUV mask onto an exposure target may include a plurality of mirrors.

SUMMARY

The inventive concepts provide a method of configuring optimized extreme ultra-violet (EUV) illumination system and an EUV exposure method using the EUV illumination system.

It will be appreciated by one of ordinary skill in the art that that the objectives and effects that could be achieved with the inventive concepts are not limited to what has been particularly described above and other objectives of the inventive concepts will be more clearly understood from the following detailed description.

According to an aspect of the inventive concepts, there is provided a method of configuring an EUV illumination system, the method including generating aerial images by performing an optical simulation with respect to each of a plurality of EUV point sources, summing up the aerial images based on EUV mapping, searching for a combination of the EUV point sources using a fitness value with respect to the summed aerial image, and configuring the EUV illumination system as a combination of the EUV point sources, which has a maximum fitness value.

According to another aspect of the inventive concepts, there is provided a method of configuring an EUV illumination system, the method including generating an aerial image indicated as an intensity of a cutline with respect to a mask pattern by performing an optical simulation on each of a plurality of EUV point sources that are configured to individually turn on/off incoherent light, performing an EUV mapping for selecting optical paths from M field facet mirrors (FFMs) to N pupil facet mirrors (PFMs) in order to configure an illumination system of the EUV point sources, with M representing a positive integer and N representing an integer greater than M, summing up the aerial images based on the EUV mapping, searching for a combination of the EUV point sources using a fitness value with respect to the summed aerial image, selecting a combination of the EUV point sources, which has a maximum fitness value, and configuring the EUV illumination system using the selected combination of the EUV point sources.

According to another aspect of the inventive concepts, there is provided an EUV exposure method including preparing an EUV mask, configuring an EUV illumination system corresponding to the EUV mask, and performing an EUV exposure on a wafer by using the EUV illumination system, wherein the configuring of the EUV illumination system includes generating aerial images by performing an optical simulation on each of plurality of EUV point sources that are individually configured to turn on/off incoherent light, summing up the aerial images based on an EUV mapping, searching for a combination of the EUV point sources using a fitness value with respect to the summed aerial image, and configuring the EUV illumination system using a combination of the EUV point sources which has a maximum fitness value.

BRIEF DESCRIPTION OF THE DRAWINGS

Embodiments will be more clearly understood from the following detailed description taken in conjunction with the accompanying drawings in which:

FIGS. 3A and 3B are conceptual diagrams for describing EUV mapping in relation to the method of configuring the EUV illumination system of FIG. 1;

FIGS. 7A to 7D and FIG. 8 are conceptual diagrams for describing the method of using the genetic algorithm of FIG. 6;

DETAILED DESCRIPTION OF THE EMBODIMENTS

Figure 1:
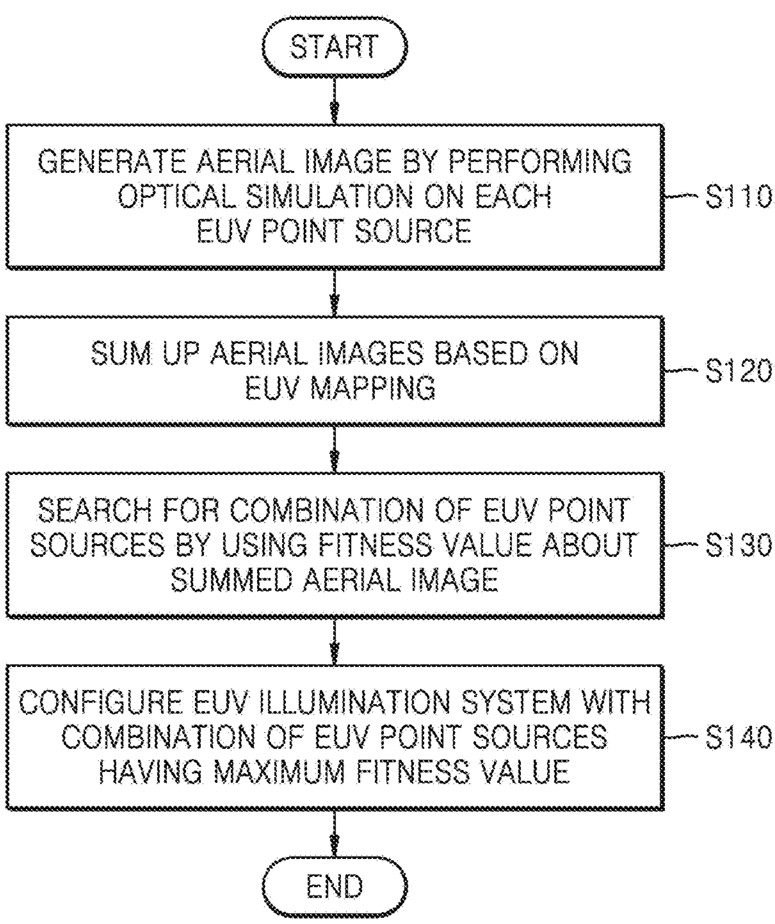
FIG. 1 is a flowchart schematically illustrating a method of configuring an extreme ultra-violet (EUV) illumination system according to at least one embodiment.

Hereinafter, one or more embodiments will be described in detail with reference to accompanying drawings. Like reference numerals denote the same elements on the drawings, and detailed descriptions thereof are omitted.

Additionally, when the terms "about" or "substantially" are used in this specification in connection with a numerical value and/or geometric terms, it is intended that the associated numerical value includes a manufacturing tolerance (e.g., ±10%) around the stated numerical value. Further, regardless of whether numerical values and/or geometric terms are modified as "about" or "substantially," it will be understood that these values should be construed as including a manufacturing or operational tolerance (e.g., ±10%) around the stated numerical value and/or geometry.

Figure 2:
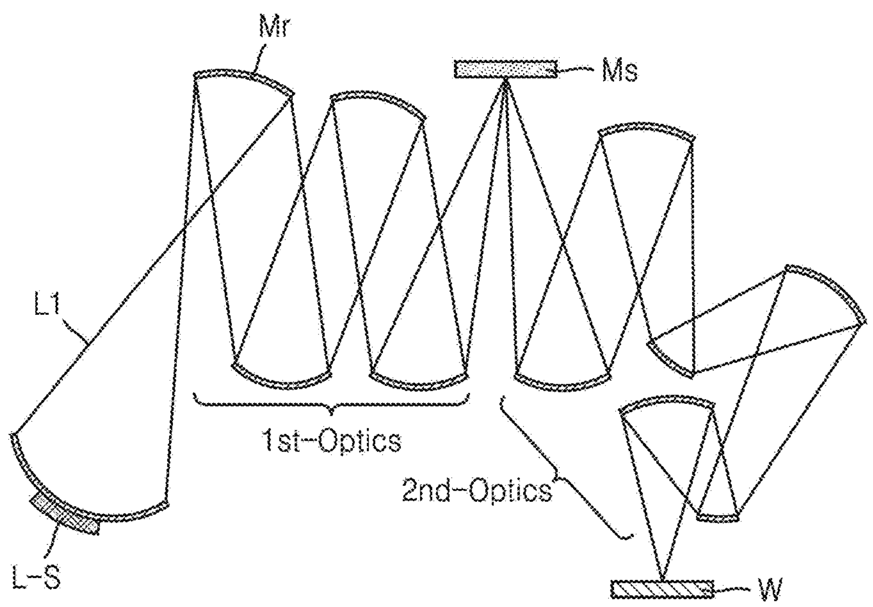
FIG. 2 is a block diagram schematically showing EUV equipment in relation to the method of configuring the EUV illumination system of FIG. 1.
Figure 3A:
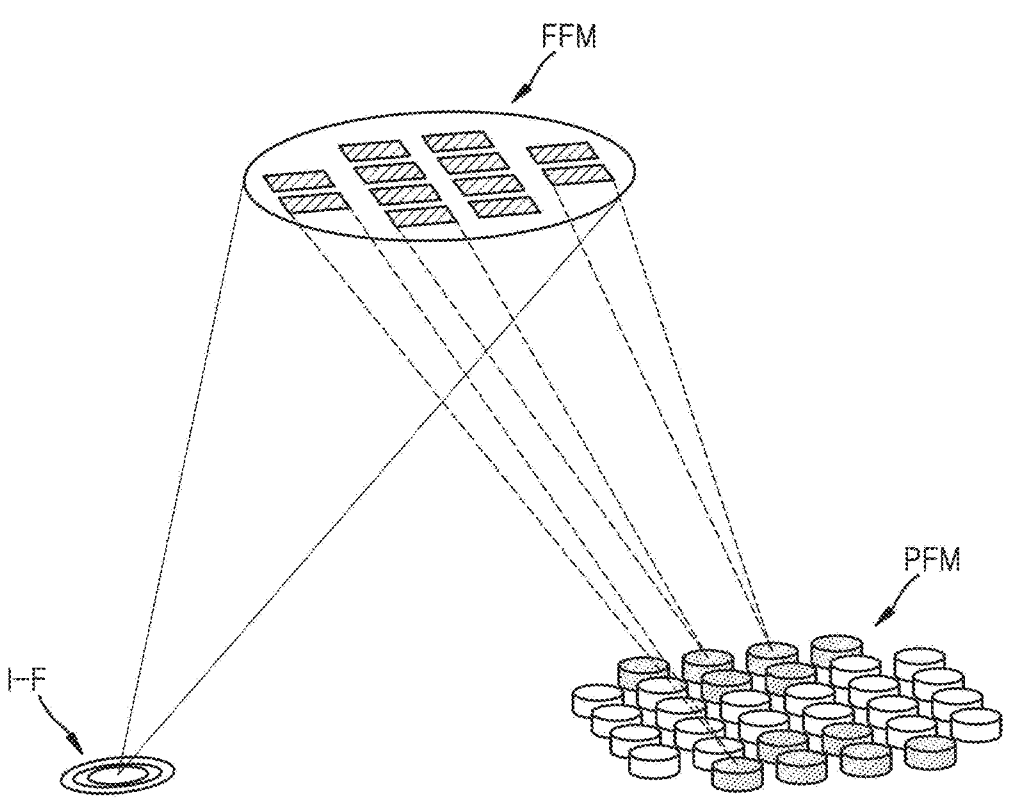
Figure 3B:
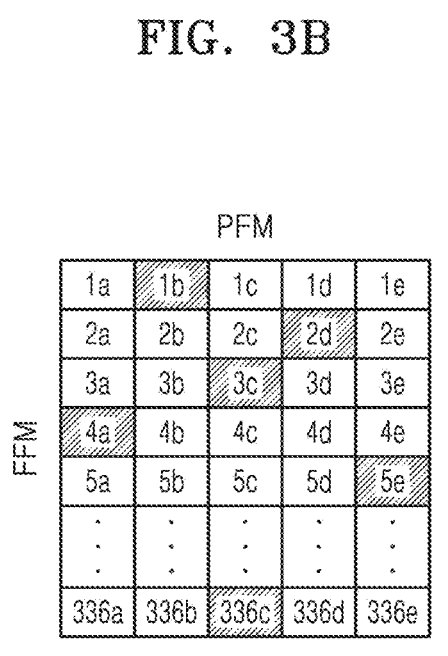
Figure 4:
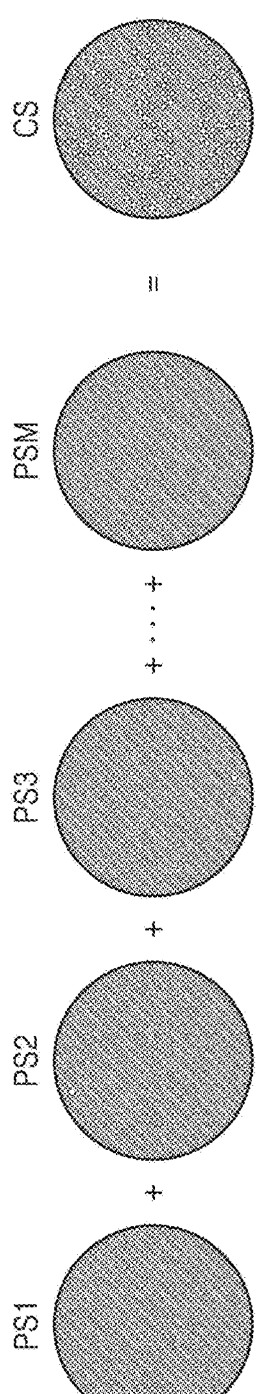
FIG. 4 is a conceptual diagram for describing concepts of EUV point sources in relation to the method of configuring the EUV illumination system of FIG. 1.

FIG. 1 is a flowchart schematically showing processes in a method of configuring an extreme ultra-violet (EUV) illumination system according to at least one embodiment, and FIG. 2 is a block diagram schematically showing EUV equipment in relation to the method of configuring the EUV illumination system of FIG. 1. FIGS. 3A and 3B are conceptual diagrams for describing EUV mapping in relation to the method of configuring the EUV illumination system of FIG. 1, FIG. 4 is a conceptual diagram for describing concepts of EUV point sources in relation to the method of configuring the EUV illumination system of FIG. 1, and FIGS. 5A to 5C are conceptual diagrams for describing processes of calculating an aerial image and summing in the method of configuring the EUV illumination system of FIG. 1.

Referring to FIGS. 1 and 2, before describing the method of configuring the EUV illumination system according to the at least one embodiment, EUV equipment may include an EUV light source L-S, a first optical system 1st-Optics, a second optical system 2nd-Optics, an EUV mask Ms, and a wafer W. The EUV light source L-S is configured to generate and output EUV light L1 of a high-energy density within a wavelength range of about 5 nm to about 50 nm. For example, the EUV light source L-S may generate and output the EUV light L1 of the high-energy density having a wavelength of 13.5 nm. For example, the EUV light source L-S may be a plasma-based light source or a synchrotron radiation light source. Here, the plasma-based light source denotes a light source that generates plasma and uses light emitted due to the plasma, and may include a laser-produced plasma (LPP) light source, a discharge-produced plasma (DPP) light source, etc.

The first optical system 1st-Optics may include a plurality of mirrors. For example, the first optical system 1st-Optics may include two to five mirrors Mr configured to select, direct, condense, and/or align the EUV light L1 (as discussed in further detail below). However, the number of mirrors in the first optical system 1st-Optics is not limited to two to five. The first optical system 1st-Optics may be referred to as an EUV illumination optics or EUV illumination system. Accordingly, in the method of configuring the EUV illumination system according to the at least one embodiment, the EUV illumination system may correspond to the first optical system 1st-Optics. However, in some embodiments, the EUV illumination system may be used as a concept including the EUV light source L-S, the first optical system 1st-Optics, and the second optical system 2nd-Optics.

The first optical system 1st-Optics may be configured to transfer EUV light L1 from the EUV light source L-S to the EUV mask Ms. For example, the EUV light L1 from the EUV light source L-S may be incident on the EUV mask Ms on a mask stage through reflections by the mirrors Mr in the first optical system 1st-Optics. In addition, the first optical system 1st-Optics may form the EUV light L1 in a curved slit form and make the EUV light L1 incident onto the EUV mask Ms. Here, the curved slit shape of the EUV light may denote two-dimensional curve of an arc shape on an X-Y plane.

The EUV mask Ms may include a reflective-type mask having a reflective region and a non-reflective and/or intermediate-reflective region. The EUV mask Ms may include a substrate formed of a low-thermal expansion coefficient material (LTEM) such as quartz, a reflective multi-layered film for reflecting EUV on the substrate, and an absorbent layer formed on the reflective multi-layered film. The reflective multi-layered form may have a structure, in which molybdenum (Mo) layers and Si layers are alternately stacked to, e.g., tens of layers. The absorbent layer may be formed of, for example, TaN, TaNO, TaBO, Ni, Au, Ag, C, Te, Pt, Pd, Cr, etc. However, the materials in the reflective multi-layered film and materials of the absorbent layer are not limited to the above examples. Here, the absorbent layer portion may correspond to the non-reflective and/or intermediate-reflective region.

The EUV mask Ms is configured to reflect the EUV light L1 incident through the first optical system 1st-Optics and makes the EUV light L1 incident on the second optical system 2nd-Optics. For example, the EUV mask Ms reflects the EUV light L1 from the first optical system 1st-Optics, and structuralizes the EUV light L1 according to the pattern formed of the reflective multi-layered film and the absorbent layer on the substrate and makes the EUV light L1 incident towards the second optical system 2nd-Optics. The EUV light L1 may be structuralized by including at least two times-refracted light based on the pattern on the EUV mask Ms. The structuralized EUV light L1 is incident towards the second optical system 2nd-Optics while retaining information about the pattern type on the EUV mask Ms, and may be projected onto an EUV exposure target (e.g., the wafer W) through the second optical system 2nd-Optics. The second optical system 2nd-Optics may be referred to as an EUV projection optics. The second optical system 2nd-Optics may include a plurality of mirrors. For example, the second optical system 2nd-Optics may include four to eight mirrors configured to direct, condense, and/or align the structuralized EUV light L1. However, the number of mirrors in the second optical system 2nd-Optics is not limited to four to eight.

The EUV mask Ms may be arranged on a mask stage. The EUV mask Ms may be moved laterally (e.g., in an x-direction and/or an y-direction) and/or horizontally (e.g., in an z-direction) due to the movement of the mask stage, and may be rotated about the x-axis, the y-axis, or z-axis due to the movement of the mask stage. The wafer W that is the EUV exposure target may be arranged on the wafer stage. The wafer W may be moved laterally (e.g., in an x-direction and/or an y-direction) and/or horizontally (e.g., in an z-direction) due to the movement of the wafer stage, and may be rotated about the x-axis, the y-axis, or z-axis due to the movement of the wafer stage.

In the method of configuring the EUV illumination system according to the at least one embodiment, an aerial image is calculated by performing an optical simulation with respect to each of EUV point sources (S110). Here, the EUV point source is a minimum unit that may be individually turned on/off, and may be generated by segmenting the EUV illumination system. A process of segmenting the EUV illumination system into the EUV point sources may be described based on the concept of EUV mapping below.

Referring to FIGS. 3A and 3B, when the light focused in the middle before the EUV light from the EUV light source L-S is focused on the EUV mask Ms is referred to as intermediate focusing light I-F, the first optical system 1st-Optics may direct the intermediate focusing light I-F to be incident on the EUV mask Ms. Thus, as shown in FIG. 3A, the intermediate focusing light I-F transferred via the first optical system 1st-Optics may correspond to a field facet mirror FFM and pupil facet mirror PFM. For example, the field facet mirror FFM may represent a shape of an electromagnetic field of the EUV light transferred through the first optical system 1st-Optics, and the pupil facet mirror PFM may represent the shape of an electromagnetic field of the EUV light on a pupil surface of the EUV mask Ms. In general, in the EUV equipment, the EUV equipment may have a restricted condition on selecting optical paths from "M" (a positive integer) field facet mirrors FFM to "N" (integer greater than M) pupil facet mirrors PFM. The above restricted condition in selecting optical paths from the field facet mirrors FFM to the pupil facet mirrors PFM may correspond to the EUV mapping.

For example, in the method of configuring the EUV illumination system according to the at least one embodiment, the EUV equipment may include 336 field facet mirrors FFM and 1620 pupil facet mirrors PFM. Also, due to the EUV mapping, from among 1620 pupil facet mirrors PFM, 336 pupil facet mirrors PFM corresponding to the 336 field facet mirrors FFM may be selected. Therefore, the 336 pupil facet mirrors PFM selected through the EUV mapping and/or the EUV light reflected by the pupil facet mirrors PFM may correspond to the EUV point sources. That is, selecting the 336 pupil facet mirrors PFM may correspond to selecting positions of the EUV point sources.

In addition, there may be enormous combinations of the pupil facet mirrors PFM or EUV point sources through the EUV mapping. However, the EUV mapping may be carried out in a manner in which one field facet mirror FFM selects one of a plurality of (e.g., four or five) pupil facet mirrors PFM. Therefore, a combination of the pupil facet mirrors PFM or a combination of EUV point sources may be configured in a two-dimensional matrix shape as shown in FIG. 3B. That is, as shown in FIG. 3B, 336 field facet mirrors FFM may be arranged in the y-direction and four or five pupil facet mirrors PFM correspond to each of the field facet mirrors FFM, and thus, a total of 1620 pupil facet mirrors PFM may be arranged. Sections hatched in FIG. 3B denote the pupil facet mirrors PFM selected through the EUV mapping.

Hereinafter, the pupil facet mirrors PFM selected through the EUV mapping and the EUV point sources are used in the same meaning, and the EUV point sources are mainly described below.

Each of the EUV point sources segmented from the EUV illumination system may have incoherence. That is, light originated from the EUV point sources at different positions may not interfere with each other. Therefore, each of the EUV point sources may be independently handled. Also, the total EUV illumination system may be configured by summing up the EUV point sources. For example, the total EUV illumination system may be configured by summing up 336 EUV point sources. FIG. 4 shows that incoherent EUV point sources PS1, PS2, PS3, . . . , PSM are added to form a cumulative source CS. The cumulative source CS may correspond to the EUV illumination system. On the contrary, the EUV illumination system, that is, the cumulative source CS, may be segmented into the EUV point sources. In FIG. 4, M may be, for example, 336.

After segmenting the EUV illumination system into the EUV point sources, an aerial image with respect to each of the EUV point sources is generated through an optical simulation. Here, the aerial image may denote that, for example, the point source is represented as an intensity profile on the x-axis and the y-axis. In addition, the optical simulation denotes a process of precisely calculating an intensity of light from the light source in a two-dimensional way (e.g., a plane) and/or a one-dimensional way (e.g., a line), and may be performed through a rigorous simulation tool. In the method of configuring the EUV illumination system according to the at least one embodiment, the optical simulation is not limited to a certain software tool, but may be performed through any kind of simulation tool provided that the intensity of light may be precisely calculated in the two-dimensional (e.g., in a plane) and/or one-dimensional way (e.g., in a line). For example, in at least one embodiment, machine learning, including an artificial neural network, a decision tree, a support vector machine, a Bayesian network, a genetic algorithm, and/or the like may be included in the simulation tool, with the machine learning trained to predict an intensity of light from the light source in a two-dimensional way (e.g., a plane) and/or a one-dimensional way based on the aerial image with respect to each of the EUV point sources as inputs. In addition, in the calculation of the aerial image with respect to the EUV point sources, a total of 1620 aerial images may be calculated in correspondence with the 1620 pupil facet mirrors PFM.

After calculating the aerial images with respect to the EUV point sources, the aerial images are added based on the EUV mapping (S120). The EUV mapping may denote a restricted condition of selecting the optical paths from the field facet mirrors FFM to the pupil facet mirrors PFM, as described above. Also, the summing-up of the aerial images may correspond to adding of the aerial images with respect to the 336 pupil facet mirrors PFM selected through the EUV mapping (e.g., the 336 EUV point sources at the positions). However, the EUV mapping is performed multiple times as described below, and thus, the summing-up of the aerial images may be performed a plurality of times. However, because the aerial images with respect to the EUV point sources at all positions, that is, the entire pupil facet mirrors PFM, are calculated in advance, it may not take a long time period to perform the adding process of the aerial images according to the EUV mapping in various combinations. Also, in the method of configuring the EUV illumination system according to the at least one embodiment, in the operation of summing up the aerial images (S120), about 1000 summed aerial images may be calculated based on the EUV mapping of about 1000 kinds. However, the number of kinds of the EUV mappings and the number of summed aerial images are not limited to 1000.

Figure 5A:
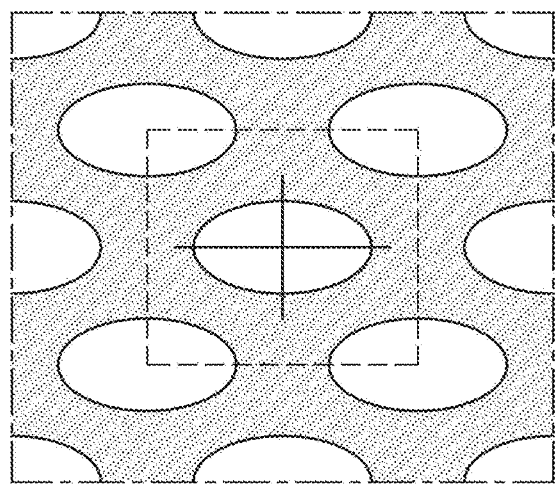
FIGS. 5A to 5C are conceptual diagrams for describing a process of calculating an aerial image and a process of summing-up in the method of configuring the EUV illumination system of FIG. 1.

FIG. 5A shows cutlines of a longer axis and a shorter axis defined to calculate the aerial image. In FIG. 5A, a square in dashed-lines denotes a simulation box, in which a solid line in the longer axis, between the solid lines of cross-shape, corresponds to an x-axis cutline and a solid line in the shorter axis corresponds to a y-axis cutline.

Figure 5B:
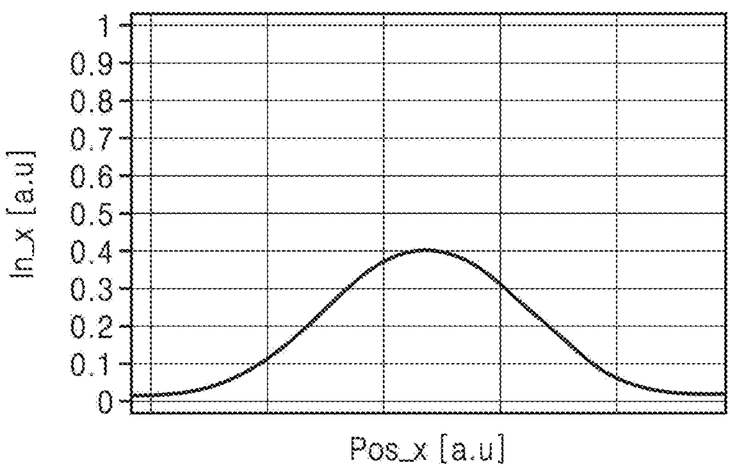
Figure 5B:
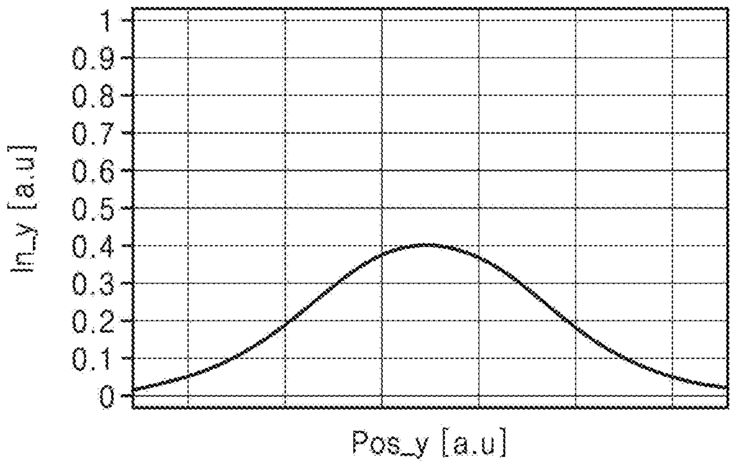

FIG. 5B shows intensities on the x-axis and y-axis cutlines due to one EUV point source. In the two graphs of FIG. 5B, transverse axes denote positions on the x-axis and the y-axis in an arbitrary (e.g., unitless) unit, and longitudinal axes denote intensities in an arbitrary unit.

Figure 5C:
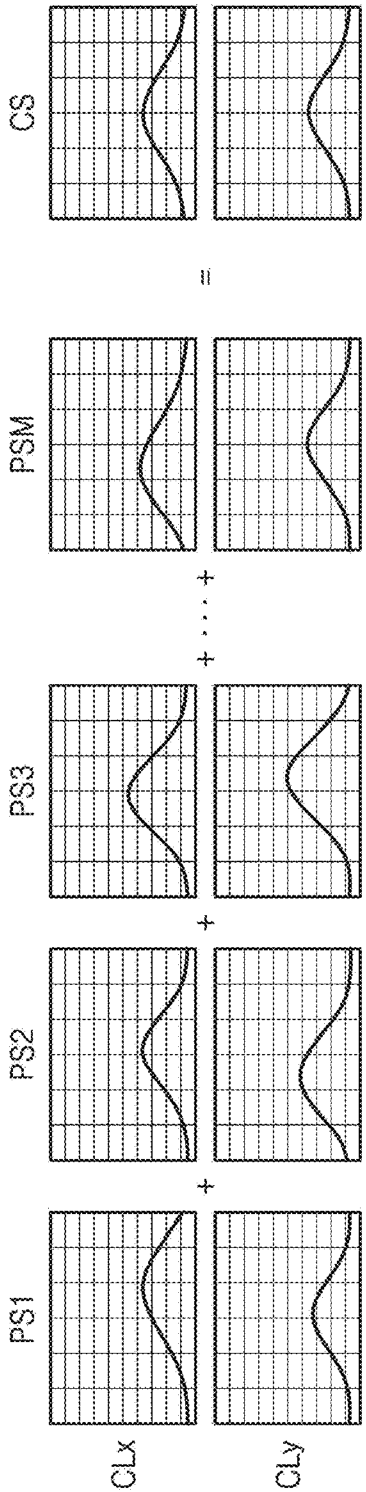

FIG. 5C shows intensity profiles on the x-axis and y-axis cutlines corresponding to EUV point sources PS1, PS2, PS3, . . . , PSM in FIG. 4, and intensity profiles on the x-axis and y-axis cut lines corresponding to the cumulative source CS. In FIG. 5C, CLx denotes the x-axis cutline and CLy denotes y-axis cutline. In addition, the intensity profile of the cumulative source CS corresponds to a sum of the intensities of all EUV point sources PS1, PS2, PS3, . . . , PSM. In FIG. 5C, the intensity profiles of the point sources PS1, PS2, PS3, . . . , PSM and the cumulative source CS are all normalized, and the intensity of the cumulative source CS and the intensity of each of the EUV point sources PS1, PS2, PS3, . . . , PSM are represented in similar sizes.

In addition, regarding the calculation of the aerial images through the optical simulation, in the general method of configuring the EUV illumination system, it takes a lot of time because the optical simulation is performed tens of thousands of times with respect to the cumulative source CS. However, in the method of configuring the EUV illumination system according to the at least one embodiment, the optical simulation is performed only with respect to the 1620 EUV point sources, and then summing-up is performed according to the EUV mapping. Thus, the time taken to perform the optical simulation may be greatly reduced. In an example with detailed numerical values, in the method of configuring the EUV illumination system according to the related art, one day or longer may be taken to perform the optical simulation processes with respect to the aerial images of the cumulative source CS. However, in the method of configuring the EUV illumination system according to the at least one embodiment, about 1.5 seconds is taken to perform the optical simulation with respect to the aerial image of one EUV point source, and only about 40 minutes may be taken to perform the optical simulations on the EUV point sources of all 1620 positions. Therefore, according to the method of configuring the EUV illumination system of the at least one embodiment, the time taken to perform the optical simulation with respect to the aerial images of the cumulative source CS may be greatly reduced, and accordingly, there may have an advantage in view of turn around time (TAT).

After summing up the aerial images, the combinations of the EUV point sources may be searched for by using a fitness value with respect to the summed aerial image. Here, the fitness value may refer to a value obtained by quantifying optical indexes and/or performance indexes of patterning in an EUV light exposure process. The fitness value may be used as a term of cost function, such that the fitness value is generally in an inverse relation to the cost function.

The performance indexes of the patterning included in the fitness value may be set, e.g., by a user. For example, the fitness value may include CD longer axis dimension, a CD shorter axis dimension, a CD aspect ratio that is a ratio between the CD longer axis and the CD shorter axis normalized image log slope (NILS), in point uniformity (IPU), mask error enhancement factor (MEEF), dose, depth of focus (DoF), etc. However, the performance indexes included in the fitness value are not limited to the above example. For the reference, NILS denotes a performance index of patterning, which increases as the CD is less changed with respect to the change in processes. In addition, as the NILS increases, as the IPU and MEEF reduce, as the dose reduces, as the CD aspect ratio closes to 1, and as the DoF increases, the fitness value may increase. Also, when calculating the fitness value, the intensity profile with respect to the cumulative source CS may be used.

A process of searching for the combination of the EUV point sources (S130) may correspond to a process of searching for an optimal combination of EUV point sources by using the fitness value and searching for an optimal method of configuring the EUV illumination system accordingly, with respect to the various EUV mappings and the combinations of the EUV point sources. For example, in the method of configuring the EUV illumination system of the at least one embodiment, the combination of the EUV point sources may be searched for by using the NILS as the fitness value. For example, in the process of searching for the combination of the EUV point sources (S130), the combination of the EUV point sources having the largest NILS may be searched for.

In addition, when considering all combinations of the EUV mapping, a time period may be excessively taken to perform the summing of the aerial images (S120) and the searching of the combination of the EUV point sources (S130). Therefore, in the method of configuring the EUV illumination system of the at least one embodiment, in order to reduce the time, in the process of searching for the combination of the EUV point sources (S130), a method of using a genetic algorithm or a Lagrange multiplier method may be used. The method of using the genetic algorithm is described in detail with reference to FIGS. 6 to 8, and the method of using the Lagrange multiplier method is described in detail with reference to FIGS. 9 to 10C.

After searching for the combination of the EUV point sources, the EUV illumination system is configured as a combination of the EUV point sources having the maximum fitness value (S140). For example, the EUV point sources corresponding to 336 pupil facet mirrors PFM having the maximum NILS may be summed up to configure the EUV illumination system.

According to the method of configuring the EUV illumination system of the at least one embodiment, the optical simulations are performed with respect to the segmented EUV point sources, and thus, the number of times of performing the optical simulations and the time taken to perform the optical simulations may be greatly reduced. Also, the optical simulation with respect to each of the EUV point sources is performed and combined, and thus, the performance indexes of the patterning, e.g., NILS, MEEF, dose, etc., may be optimized in high level. Moreover, because an initial illumination system is not set, it is advantageous to access global optimum. In addition, because the user may freely set the optical indexes or the performance indexes of the patterning and use it as the fitness value or the cost function, the optical indexes that the user significantly considers may be reflected in configuring of the EUV illumination system.

For the reference, in a method of configuring the EUV illumination system according to a comparative example, starting from an initial EUV illumination system obtained through cartography and rendering the EUV illumination system converged through the EUV illumination systems of the intermediate step, is performed. However, the related process may be largely affected by the skill and know-how of an engineer who sets the initial EUV illumination system and related parameters. In addition, because the performance of the EUV illumination system deteriorates during the iteration process of the parameterized EUV illumination system and the rendering process of the EUV illumination system, there are many insufficiencies in optimizing various optical indexes including after develop inspection (ADI), CD aspect ratio, dose, IPU, and the like; and there is a risk of falling into local optimum (e.g., a false optimum). On the other hand, in the case of the intermediate sources, there is a large difference in the performance of the illumination system depending on the parameterization type, there is a limitation in improving the performance of the illumination system because the EUV illumination system may not express the parameterized illumination system as it is, and there is a limitation in setting the cost function. On the contrary, in the method of configuring the EUV illumination system according to the at least one embodiment, the above issues may be addressed.

Figure 6:
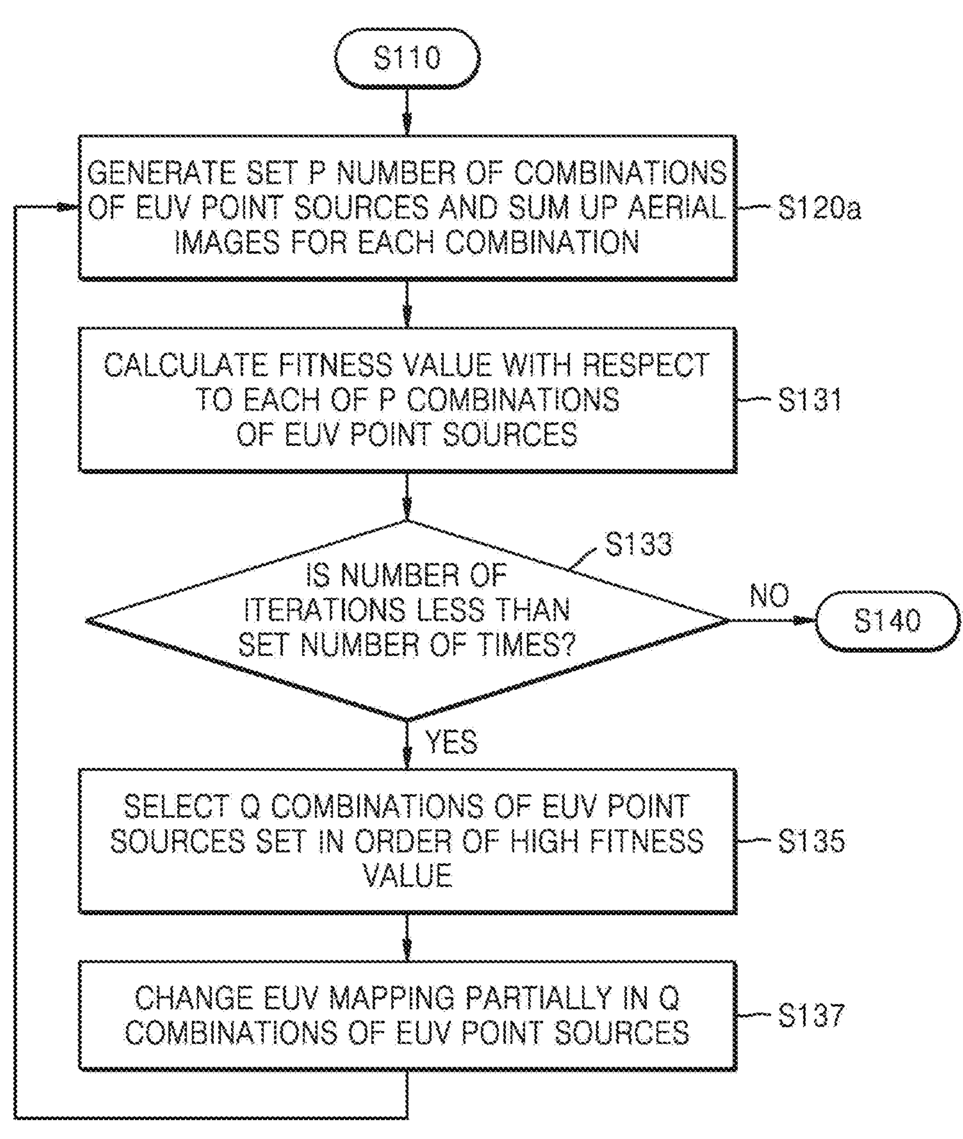
FIG. 6 is a flowchart illustrating a method of using a genetic algorithm in a process of searching for a combination of point sources in the method of configuring the EUV illumination system of FIG. 1.

FIG. 6 is a flowchart illustrating a method of using a genetic algorithm in a process of searching for a combination of point sources in the method of configuring the EUV illumination system of FIG. 1, and FIGS. 7A to 7D and FIG. 8 are conceptual diagrams for describing a method of using the genetic algorithm of FIG. 6.

Figure 7A:
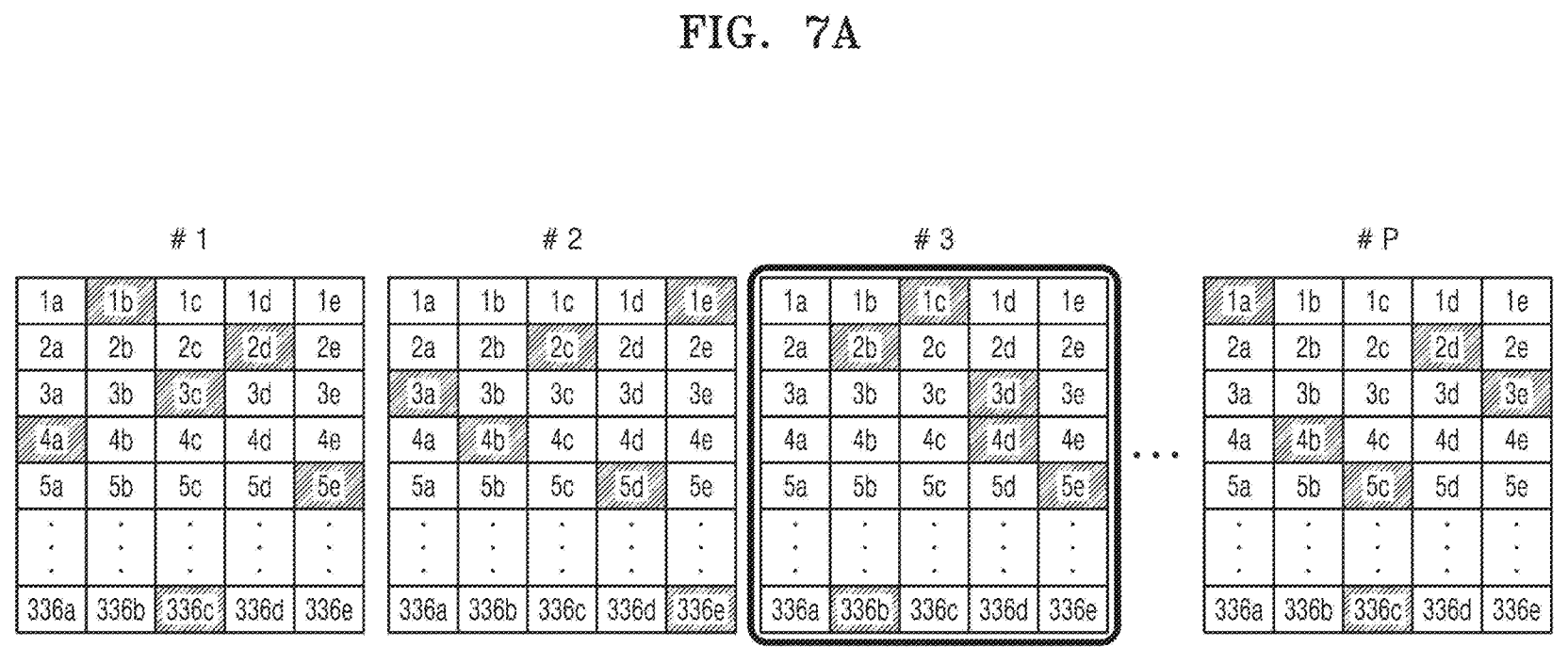
Figure 7B:
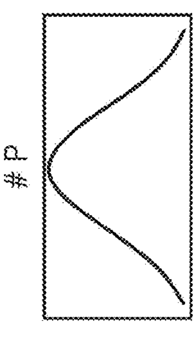
Figure 7B:
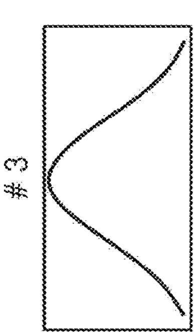
Figure 7B:
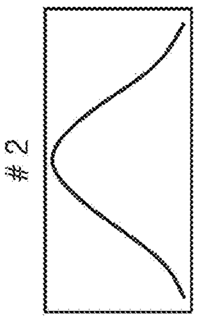
Figure 7B:
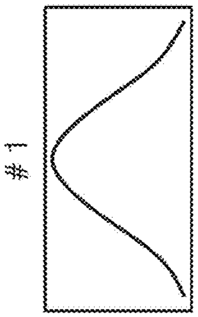
Figure 7C:
Figure 7C:
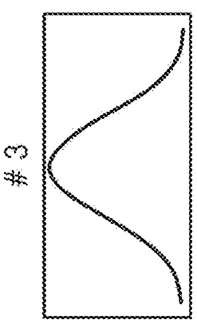
Figure 7C:
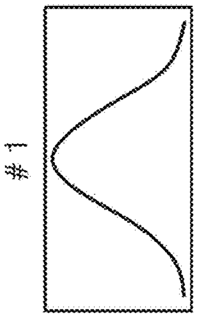

Referring to FIGS. 6 to 7C, in the method of configuring the EUV illumination system according to the at least one embodiment, before a process of searching for a combination of the EUV point sources (S130*a*), P (P is a positive integer) combinations of the EUV point sources are generated, and the aerial images are summed up with respect to each of the combinations in a process of summing up the aerial images (S120*a*). The P combinations of the EUV point sources may be based on P kinds of EUV mappings. For example, P may denote 1000. However, P is not limited to 1000, and may be more or less than 1000.

Next, in the process of searching for the combination of the EUV point sources (S130*a*), a fitness value is calculated with respect to each of the P combinations of the EUV point sources based on the genetic algorithm (S131). Various factors may be included in the fitness value. The fitness value is described in more detail below with reference to FIG. 7D.

After that, whether the number of iterations is less than a set number of times is determined (S133). When the number of iterations is equal to or greater than the set number of times (NO), a process of configuring the EUV illumination system with the combination of the EUV point sources (S140) is performed.

When the number of iterations is less than the set number of times (YES), Q combinations of the EUV point sources, which are set in an order of large fitness value, are selected (S135). Q may be, for example, 100. However, Q is not limited to 100, and may be more or less than 100.

After that, some of the EUV mappings in the Q combinations of the EUV point sources are changed (S137). For example, when P is 1000 and Q is 100, the EUV mappings of the 900 combinations of the EUV point sources are removed, and the EUV mapping in each of the 100 combinations of the EUV point sources is partially changed to generate 900 new EUV mappings. As described above, the EUV mapping is changed in the combinations of the EUV point sources having the greater fitness values because a possibility of obtaining greater fitness value is increased when the EUV mapping is changed in the combinations of the EUV point sources having greater fitness value. A program or an algorithm of searching for the fitness value based on the above concept may also be referred to as a genetic algorithm.

After that, a process of summing up the aerial images (S120*a*) is performed again, and then, P combinations of the EUV point sources are generated again, and the aerial images are summed up with respect to each of the combinations of the EUV point sources. Here, the P combinations of the EUV point sources may include (P-Q) new combinations of the EUV point sources, which are generated through the partial change in the Q EUV mappings.

In FIG. 7A, P combinations of the EUV point sources are shown. In addition, in FIGS. 7B and 7C, summed aerial images with respect to each of the P combinations of the EUV point sources are shown. In detail, FIG. 7B shows the intensity profile on the x-axis with respect to each combination of the EUV point sources, and FIG. 7C shows the intensity profile on the y-axis with respect to each combination of the EUV point sources. In addition, in FIG. 7A, the third combination of the EUV point sources, which has the largest fitness value, is surrounded by a thick solid-lined square. Beforehand, the Q combinations of the EUV point sources may be selected in an order of large fitness values, including the third one.

Referring to FIGS. 6 and 7D, FIG. 7D shows a table indicating the process of calculating the fitness values with respect to the P combinations of the EUV point sources. CDx and CDy may be calculated as widths of a threshold intensity (see 'TH' in FIG. 10C) in the summed aerial image with respect to each of the combinations of the EUV point sources. Ratio denotes the CD aspect ratio, and represents a ratio between CDx and CDy. NILSx denotes a NILS value at a point where the CDx is defined and NILSy denotes a NILS value at a point where CDy is defined. An example of the NILS is described in more detail with reference to FIGS. 9 to 10C.

$Fitness_{NILS}$ denotes a first fitness value calculated based on NILSx and NILSy, and $Fitness_{ratio}$ denotes a second fitness value calculated based on the CD aspect ratio. The first fitness value may be calculated by applying a conversion factor and a weight value to NILSx and NILSy. Also, Fitness-ratio may be calculated by applying a conversion factor to the CD aspect ratio. Fitness in the last line of the table denotes a final fitness value, and may be calculated by applying a weight value to the first fitness value and the second fitness value. As shown in FIG. 7D, the third combination of the EUV point sources has the largest fitness value.

Figure 8:
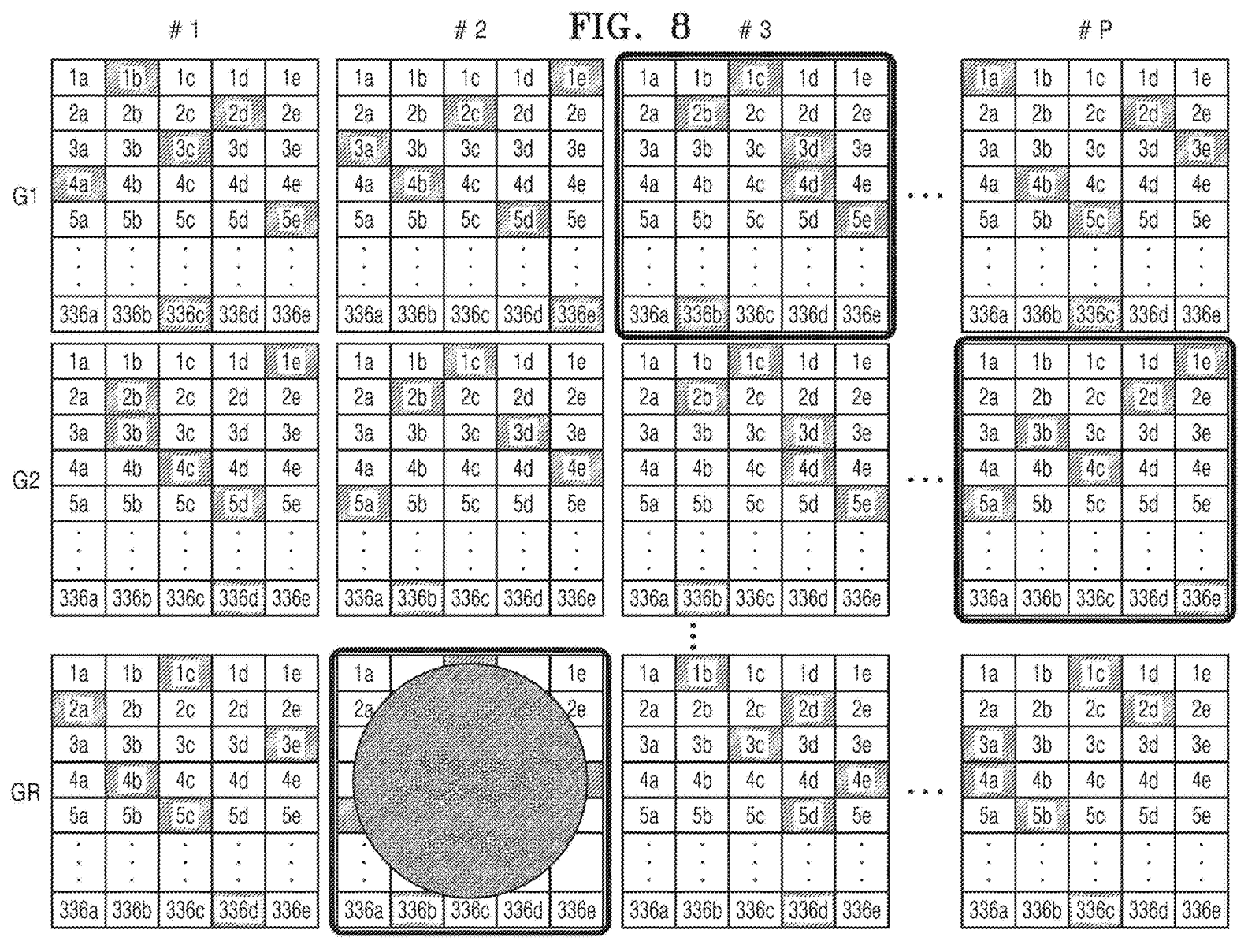

Referring to FIGS. 6 and 8, when the P combinations of the EUV point source shown in FIG. 7A are referred to as a first generation G1, FIG. 8 shows P combinations of the EUV point sources with respect to R generations (G1, G2, . . . , GR) by repeatedly performing the processes from the process of calculating the fitness value (S131) to the process of changing the EUV mappings partially (S137), and the process of summing up the aerial images (S120*a*) the set number of times, e.g., R times. For example, R may denote 300. However, R is not limited to 300, and may be more or less than 300.

In addition, in FIG. 8, the combinations of the EUV point sources having the largest fitness values in respective generations are surrounded by thick solid-lined squares. In more detail, in the first generation G1, the fitness value of the third combination of the EUV point sources is the largest, in the second generation G2, the fitness value of the P-th combination of the EUV point sources is the largest, and in an R-th generation (GR), the fitness value of the second combination of the EUV point sources is the largest. Consequently, the second combination of the EUV point sources in the R-th generation GR may have the largest fitness value. In other words, in the process of searching for the combination of the EUV point sources (S130*a*) in the method of configuring the EUV illumination system according to the at least one embodiment, the second combination of the EUV point sources in the R-th generation GR may be selected as the combination of the EUV point sources, having the largest fitness value, by using the genetic algorithm. After that, in the process of configuring the EUV illumination system (S140), the EUV illumination system is configured by using the selected combination of the EUV point sources, and then, an optimal EUV illumination system may be obtained. In FIG. 8, the EUV illumination system corresponding to the second combination of the EUV point sources in the R-th generation GR is also shown.

Figure 9:
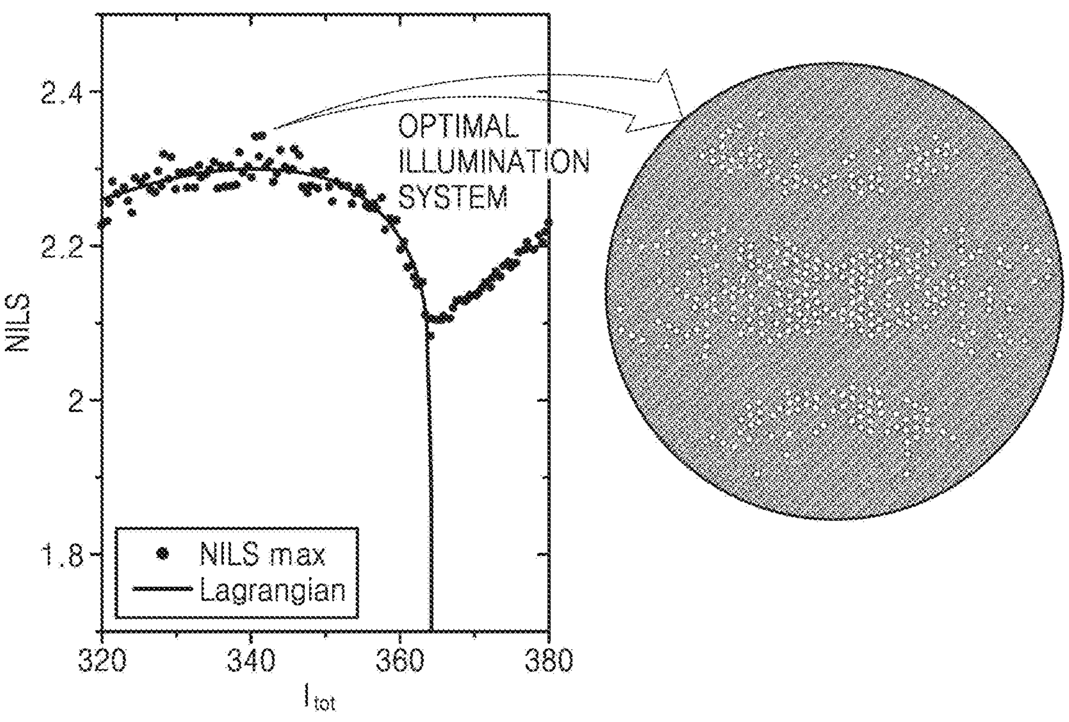
FIG. 9 is a conceptual diagram for describing a method of using a Lagrange multiplier method in the process of searching for a combination of point sources in the method of configuring the EUV illumination system, shown in FIG. 1.

FIG. 9 is a conceptual diagram for describing the method of using the Lagrange multiplier method in the process of searching for the combination of the EUV point sources in the method of configuring the EUV illumination system in FIG. 1, and FIGS. 10A to 10C are conceptual diagrams for describing a CD targeting, NILS, and a dose map in relation to the method of configuring the EUV illumination system of FIG. 1.

Referring to FIG. 9, the Lagrange multiplier method is a method mainly used to find a maximum value of a function having a restricted condition. According to basic principles of the Lagrange multiplier method, an issue of maximizing f(x) under a restricted condition g(x)=0 may be addressed by defining a new function $L(x,\lambda)\equiv f(x)+\lambda g(x)$ and finding x* where a partial differential value becomes 0 for two variables x and λ. That is, f(x*) may correspond to a maximum value of f(x) satisfying the restricted condition.

In the process of searching for the combination of the EUV point sources (S130_b_) in the method of configuring the EUV illumination system according to the at least one embodiment, an issue of finding a combination of the EUV point sources where the fitness value is the largest may be changed into an issue of maximizing NILS in a target CD when an object of the fitness value is NILS. The function L having the restricted condition may be defined by Equation (1) below.

$$L(I_i, \lambda) = NILS - \lambda\sum_{i=1}^{336}\left(I_i^T - I_i\right) \tag{1}$$

Here, NILS includes NILSx and NILSy, and the NILSx may be expressed as $$\sum_{i=1}^{336}\frac{CDx}{I_{tot}}\frac{dI_i}{dx}$$

and NILSy may be expressed as $$\sum_{i=1}^{336}\frac{CDy}{I_{tot}}\frac{dI_i}{dy}.$$

Ii denotes an intensity of the aerial image made by an i-th EUV point source. In Equation (1) above, NILS has to be maximized and $$\sum_{i=1}^{336}\left(I_i^T - I_i\right)$$

indicating a difference from the target CD has to be minimized.

In addition, $$I_{tot} = \sum_{i=1}^{336} I_i$$

and denotes a total intensity of the aerial images in the target CD, and when $I_{tot}$ is fixed as a certain value $I_0$ for implementing the target CD, the optimization issue of the function L having the restricted condition may be changed into an issue of fining the maximum value of NILS under the conditions of $I_{tot}=I_0$ and Equation (1) may be changed into $L(Ii,\lambda)=NILS+\lambda(I_{tot}-I_0)$.

The graph of FIG. 9 expresses Equation 1 above, and a solid line corresponds to the restricted condition and maximum values of NILS are shown as points. Therefore, the optimization of the function L in Equation 1 above is a problem of finding NILS that is adjacent to the solid line and has the maximum value in the graph. In FIG. 9, an enlarged view shows the optimal EUV illumination system including the combination of the EUV point sources that are adjacent to the solid line and correspond to the maximum NILS.

Figure 10A:
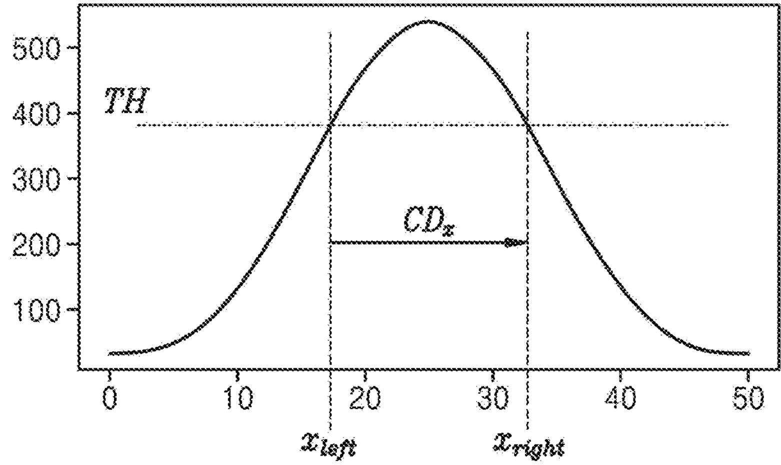
FIGS. 10A to 10C are conceptual diagrams for describing a critical dimension (CD) targeting, normalized image log slope (NILS), and dose map in relation to the method of configuring the EUV illumination system of FIG. 1.

FIG. 10A shows the CD targeting. Beforehand, the CD targeting has to be performed in order to minimize a difference from the target CD, that is, $I_{tot}=I_0$. For the reference, the CD targeting may denote that a level of a threshold intensity TH is set with respect to the aerial image so that a pattern of a required CD value may be patterned. In addition, in CD targeting, aerial CD has an offset from an ADI CD that is actually patterned, but the offset value is consistent in a set CD range, and the CD targeting may be performed considering this. FIG. 10A shows a target CDx set through CD targeting on an x-axis. That is, the target CDx may be set through setting of the threshold intensity TH on the x-axis.

Figure 10B:
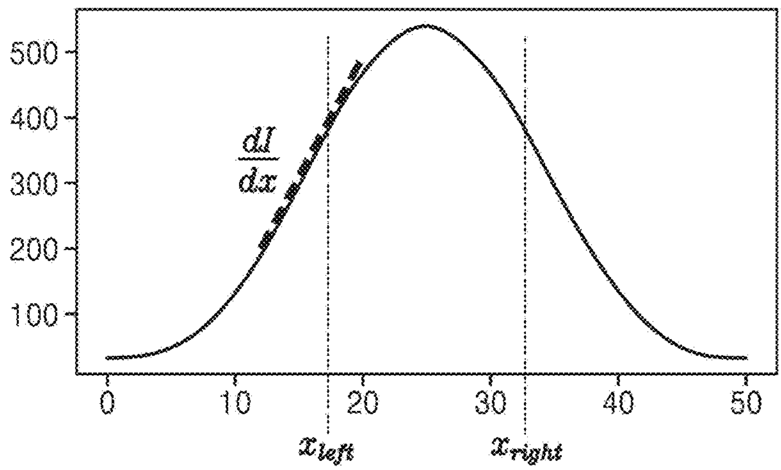

FIG. 10B shows a concept of NILS. NILS may be defined as $$\frac{CDx}{I}\frac{dI}{dx}$$

on the x-axis. That is, NILS may be defined as a CD value (CDx), an intensity value (I) of the aerial image at a point where the CD value is defined, and a differential value of the intensity (dI/dx). NILS may be defined in the same concept on the y-axis. In FIG. 10B, the differential value of the intensity at the point where the CD value is defined, that is, a slope of the intensity, is shown in dashed lines. As described above, NILS is a performance index of patterning showing a characteristic, in which the CD value is less changed with respect to the changes in processes such as dose, focus, etc. as the value thereof increases.

Figure 10C:
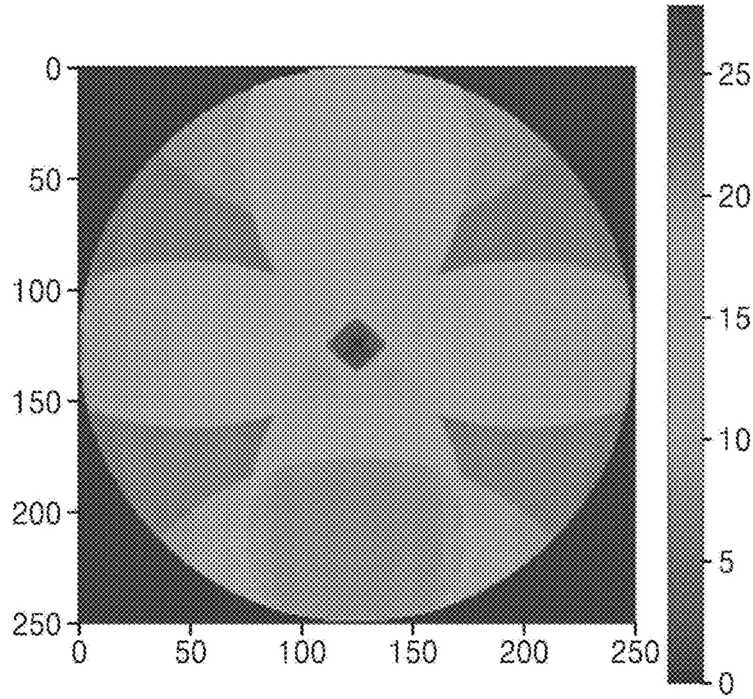

FIG. 10C shows an intensity map (or a dose map). The dose map may be obtained by integrating intensity graphs of aerial images generated by respective EUV point sources. In the method of configuring the EUV illumination system according to the at least one embodiment, for reducing the dose, the restricted condition and/or the performance indexes of the fitness value may be corrected in consideration of the dose map.

For the reference, according to the method of configuring the EUV illumination system of the at least one embodiment, it is identified that IPU is improved by about 10% when using the genetic algorithm, and the IPU is improved by about 20% by using the Lagrange multiplier method, as compared with the method of configuring the EUV illumination system according to the comparative example. Also, the method of configuring the EUV illumination system according to the at least one embodiment may not only search for the optimal illumination system with respect to a set mask pattern, but may be also applied to an EUV source mask optimization method when being applied individually to a mask pattern, to which various biases are applied, or various kinds of mask patterns.

Here, the application of bias may denote applying a bias such as variations in the longer axis and shorter axis of the mask pattern, rotation variation, etc. Moreover, in the method of configuring the EUV illumination system according to the at least one embodiment, a time taken for the optical simulation on one EUV point source that is segmented is calculated as 1.5 sec., and about 40 minutes may be taken to perform the optical simulation on the entire 1620 EUV point sources. Also, the time taken to perform the optical simulation may be further reduced by performing parallel operation or using an optical simulation tool of faster speed, etc.

Figure 11:
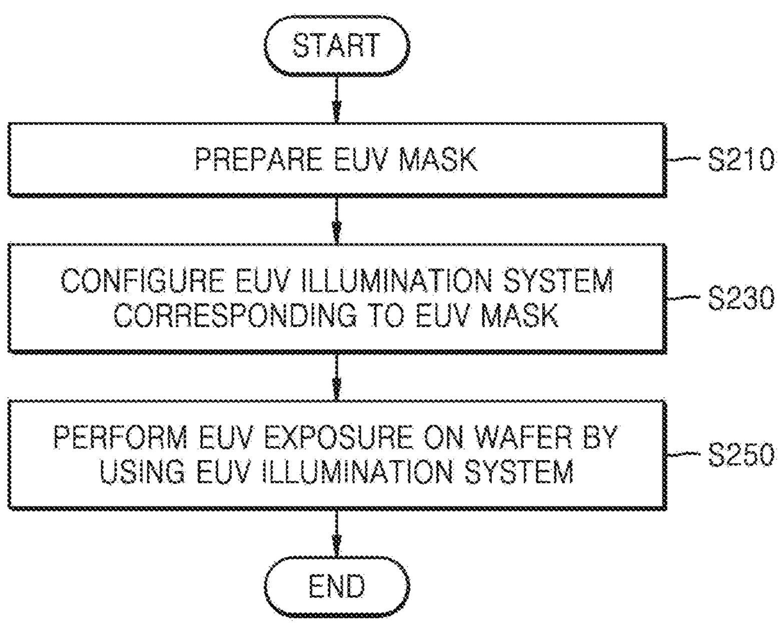
FIG. 11 is a flowchart schematically showing processes in an EUV exposure method using the EUV illumination system according to at least one embodiment.

FIG. 11 is a flowchart schematically showing processes in an EUV exposure method using the EUV illumination system according to at least one embodiment. Descriptions will be described with reference to FIG. 1, either, and the descriptions provided above with reference to FIGS. 1 to 10C will be briefly provided or omitted.

Referring to FIG. 11, in the EUV exposure method using the EUV illumination system according to the at least one embodiment (hereinafter, simply referred to as 'EUV exposure method'), an EUV mask is prepared (S210). Here, the EUV mask may be the same as and/or substantially similar to the EUV mask Ms in the EUV equipment described above with reference to FIG. 2. For example, preparing of the EUV mask may denote that an EUV mask having a certain mask pattern is prepared.

After preparing the EUV mask, an EUV illumination system corresponding to the EUV mask is configured (S230). The configuring of the EUV illumination system (S230) may include the method of configuring the EUV illumination system of FIG. 1. Therefore, the optimal EUV illumination system may be configured through the various processes described above with reference to the method of configuring the EUV illumination system shown in FIG. 1. In addition, in the EUV exposure method of the at least one embodiment, the configuring of the EUV illumination system (S230) may include configuring the entire EUV illumination system.

After configuring the EUV illumination system, EUV exposure is performed on a wafer using the EUV illumination system (S250). For example, the EUV exposure may denote that EUV light is projected onto a photoresist (PR) layer for EUV on the wafer. In addition, in some embodiments, the EUV exposure may include a process of developing the PR layer. In other words, the PR pattern may be formed through the developing process on the PR layer.

In the EUV exposure method of the at least one embodiment, the process of configuring the EUV illumination system (S230) includes the method of configuring the EUV illumination system of FIG. 1, and thus, the optimal EUV illumination system may be configured, and the optimal and/or enhanced EUV exposure may be performed based on the optimal EUV illumination system. Therefore, in at least some embodiments, the PR pattern optimally suitable for the required performance indexes in the pattern may be formed on the wafer.

While the inventive concepts have been particularly shown and described with reference to embodiments thereof, it will be understood that various changes in form and details may be made therein without departing from the spirit and scope of the following claims.

What is claimed is:

1. A method of configuring an extreme ultraviolet (EUV) illumination system, the method comprising:

generating a library of independent aerial images, each of the aerial images being generated by performing an optical simulation with respect to each of a plurality of EUV point sources, each EUV point source corresponding to a respective optical path defined by an assignment between a field facet mirror (FFM) and a pupil facet mirror (PFM);

performing an EUV mapping that defines combinations of the EUV point sources, wherein the EUV mapping corresponds to a predetermined condition of selecting optical paths from M FFMs to N PFMs, where M represents a positive integer and N represents an integer greater than M;

for each of the combinations defined by the EUV mapping, summing up the aerial images corresponding to EUV point sources included in the combination, without performing an additional optical simulation for the combination;

searching, from among the combinations defined by the EUV mapping, for a combination of the EUV point sources using a fitness value with respect to the summed aerial images, wherein the fitness value is calculated based on quantifying at least one of (i) optical indexes or (ii) performance indexes of patterning in an EUV light exposure process; and physically configuring the EUV illumination system by directing light from a plurality of FFMs along optical paths to a plurality of PFMs according to the combination of the EUV point sources having a maximum fitness value.

2. The method of claim 1, wherein each of the plurality of EUV point sources is a minimum unit that is configured to be individually turned on/off, and EUV light from the plurality of EUV point sources at different locations has incoherence with each other.

3. The method of claim 1, wherein the aerial images are represented as graphs of an intensity of a cutline with respect to a mask pattern.

4. The method of claim 1, wherein the aerial images, with respect to EUV point sources, are generated through the optical simulation.

5. The method of claim 1, wherein, in the searching of the combination of the EUV point sources, a genetic algorithm is used.

6. The method of claim 5, wherein, in the summing up of the aerial images, P combinations of the EUV point sources are generated, with P representing a positive integer, and the aerial images are summed with respect to each of the combinations of the EUV point sources;

wherein the searching of the combination of the EUV point sources comprises determining the fitness value with respect to each of the P combinations of the EUV point sources, selecting Q combinations of the EUV point sources, which are set in an order of large fitness values, with Q representing a positive integer less than P, and modifying a subset of the EUV mappings in each of the Q combinations of the EUV point sources while maintaining remaining EUV mappings, wherein, after the modifying the subset of the EUV mappings, the summing up of the aerial images is performed;

wherein the determining of the fitness value, the selecting of the Q combinations, and the modifying of the subset of the EUV mappings are repeatedly performed a predetermined number of times; and wherein, in the configuring of the EUV illumination system, after the performance of the determining of the fitness value, the selecting of the Q combinations, and the modifying the subset of the EUV mappings the predetermined number of times, the EUV illumination system is configured using the EUV point sources included in the combination having the maximum fitness value.

7. The method of claim 6, wherein the fitness value is a weighted total of performance indexes comprising at least one of a critical dimension (CD) longer axis, a CD shorter axis, a CD aspect ratio that is a ratio between the CD longer axis and the CD shorter axis, a longer axis normalized image log slope (NILS), a shorter axis NILS, or dose.

8. The method of claim 1, wherein, in the searching of the combination of the EUV point sources, a Lagrange multiplier method is used.

9. The method of claim 8, wherein, in the Lagrange multiplier method, a function L, representing the predetermined condition, is defined by Equation 1 below in order to find an optimal combination of the EUV point sources based on normalized image log slopes (NILS) including NILSx and NILSy, $$L(I_i,\lambda)=\mathrm{NILS}-\lambda(I_{tot}-I_0) \quad (1),$$

the NILSx of the NILS is expressed as $$\sum_{i=1}^{M}\frac{CD_x}{I_{tot}}\frac{dI_i}{dx},$$

the NILSy of the NILS is expressed as $$\sum_{i=1}^{M}\frac{CD_y}{I_{tot}}\frac{dI_i}{dy},$$

and $I_{tot}$ is $$\sum_{i=1}^{M}I_i$$

and represents a total intensity of the aerial images in a target critical dimension (CD) and $I_0$ denotes a value used in implementing the target CD, under a condition of $I_{tot}=I_0$, a problem of finding the optimal combination of the EUV point sources is changed into a problem of maximizing the NILS, and the optimal combination determined by maximizing the NILS under the condition of $I_{tot}=I_0$ is used to physically configure the EUV illumination system.

10. The method of claim 9, wherein the NILS corresponds to a slope of an intensity at a point where the target CD is defined, and the NILS has a characteristic in which the CD is less changed with respect to a change in processes as a value of the NILS increases.

11. The method of claim 1, wherein the method is applied to a mask pattern to which a bias is applied or to a plurality of mask patterns.

12. A method of configuring an extreme ultraviolet (EUV) illumination system, the method comprising:

generating aerial images, indicated as an intensity of a cutline with respect to a mask pattern, each of the aerial images being generated by performing an optical simulation on each of a plurality of EUV point sources that are individually configured to turn on/off incoherent light;

performing an EUV mapping for selecting optical paths from M field facet mirrors (FFMs) to N pupil facet mirrors (PFMs) in order to configure an illumination system of the EUV point sources, wherein the EUV mapping corresponds to a predetermined condition of selecting the optical paths from M FFMs to N PFMs, where M represents a positive integer and N represents an integer greater than M;

summing up the aerial images based on the EUV mapping;

searching for a combination of the EUV point sources using a fitness value with respect to the summed aerial images, wherein the fitness value is calculated based on quantifying at least one of (i) optical indexes or (ii) performance indexes of patterning in an EUV light exposure process; and physically configuring the EUV illumination system based on the combination of the EUV point sources having a maximum fitness value.

13. The method of claim 12, wherein the aerial images with respect to N EUV point sources are generated through the optical simulation.

14. The method of claim 12, wherein, in the summing up of the aerial images, P combinations of the EUV point sources are generated, with P representing a positive integer, and the aerial images are summed with respect to each of the combinations of the EUV point sources;

wherein in the searching of the combination of the EUV point sources, a genetic algorithm is used;

wherein the searching of the combination of the EUV point sources comprises determining the fitness value with respect to each of the P combinations of the EUV point sources, selecting Q combinations of the EUV point sources, which are set in an order of large fitness values, with Q representing a positive integer less than P, and modifying a subset of the EUV mappings in each of the Q combinations of the EUV point sources, wherein, after the modifying the subset of the EUV mappings, the summing of the aerial images is performed, wherein the determining of the fitness value, the selecting of the Q combinations, and the modifying of the subset of the EUV mappings are repeatedly performed a predetermined number of times, and wherein, in the configuring of the EUV illumination system, after the performance of the determining the fitness value, the selecting the Q combinations, and the modifying the subset of the EUV mappings the predetermined number of times, the EUV illumination system is configured using the EUV point sources included in the combination having the maximum fitness value.

15. The method of claim 12, wherein in the searching of the combination of the EUV point sources, a Lagrange multiplier method is used, and wherein in the Lagrange multiplier method a function L, representing a predetermined condition, is defined by Equation 1 below in order to find an optimal combination of the EUV point sources based on normalized image log slopes (NILS) including NILSx and NILSy, $$L(I_i,\lambda)=\text{NILS}-\lambda(I_{tot}-I_0) \quad (1),$$

the NILSx of the NILS is expressed as $$\sum_{i=1}^{M}\frac{CD_x}{I_{tot}}\frac{dI_i}{dx},$$

the NILSy of the NILS is expressed as $$\sum_{i=1}^{M}\frac{CD_y}{I_{tot}}\frac{dI_i}{dy},$$

and $I_{tot}$ is $$\sum_{i=1}^{M}I_i$$

and represents a total intensity of the aerial images in a target critical dimension (CD) and $I_0$ denotes a value used in implementing the target CD, under a condition of $I_{tot}=I_0$, a problem of finding the optimal combination of the EUV point sources is changed into a problem of maximizing the NILS, and the optimal combination determined by maximizing the NILS under the condition of $I_{tot}=I_0$ is used to physically configure the EUV illumination system.

16. An extreme ultraviolet (EUV) exposure method comprising:

preparing an EUV mask;

configuring an EUV illumination system corresponding to the EUV mask; and performing an EUV exposure on a wafer using the EUV illumination system, wherein the configuring of the EUV illumination system comprises generating aerial images, each of the aerial images being generated by performing an optical simulation on each of a plurality of EUV point sources that are individually configured to turn on/off incoherent light, summing up the aerial images based on an EUV mapping, wherein the EUV mapping corresponds to a predetermined condition of selecting optical paths from M field facet mirrors (FFMs) to N pupil facet mirrors (PFMs), where M represents a positive integer and N represents an integer greater than M, searching for a combination of the EUV point sources using a fitness value with respect to the summed aerial images, wherein the fitness value is calculated based on quantifying at least one of (i) optical indexes or (ii) performance indexes of patterning in an EUV light exposure process, and physically configuring the EUV illumination system based on a combination of the EUV point sources having a maximum fitness value.

17. The EUV exposure method of claim 16, wherein the aerial images, with respect to N EUV point sources, are generated through the optical simulation.

18. The EUV exposure method of claim 17, wherein, in the summing up of the aerial images, P combinations of the EUV point sources are generated, with P representing a positive integer, and the aerial images are summed with respect to each of the combinations of the EUV point sources;

wherein the searching of the combination of the EUV point sources, a genetic algorithm is used;

wherein the searching of the combination of the EUV point sources comprises determining the fitness value with respect to each of the P combinations of the EUV point sources, selecting Q combinations of the EUV point sources, which are set in an order of large fitness values, with Q representing a positive integer less than P, and modifying a subset of the EUV mappings in each of the Q combinations of the EUV point sources, wherein, after the modifying the subset of the EUV mappings, the summing up of the aerial images is performed, wherein the determining of the fitness value, the selecting of the Q combinations, and the modifying of the subset of the EUV mappings are repeatedly performed a predetermined number of times, and wherein, in the configuring of the EUV illumination system, after the determining the fitness value, the selecting the Q combinations, and the modifying the subset of the EUV mappings the predetermined number of times, the EUV illumination system is configured using the EUV point sources included in the combination having the maximum fitness value.

19. The EUV exposure method of claim 17, wherein, in the searching of the combination of the EUV point sources, a Lagrange multiplier method is used, and wherein in the Lagrange multiplier method a function L, representing the predetermined condition, is defined by Equation 1 below in order to find an optimal combination of the EUV point sources based on normalized image log slopes (NILS) including NILSx and NILSy, $$L(I_i,\lambda)=\text{NILS}-\lambda(I_{tot}-I_0) \quad (1),$$

the NILSx of the NILS is expressed as $$\sum_{i=1}^{M}\frac{CD_x}{I_{tot}}\frac{dI_i}{dx},$$

and the NILSy of the NILS is expressed as $$\sum_{i=1}^{N}\frac{CD_y}{I_{tot}}\frac{dI_i}{dy},$$

$I_{tot}$ is $$\sum_{i=1}^{M}I_i$$

and represents a total intensity of the aerial images in a target critical dimension (CD) and $I_0$ denotes a value used in implementing the target CD, and under a condition of $I_{tot}=I_0$, a problem of finding the optimal combination of the EUV point sources is changed into a problem of maximizing the NILS, and the optimal combination determined by maximizing the NILS under the condition of $I_{tot}=I_0$ is used to physically configure the EUV illumination system.

* * * * *